US00RE45885E

(19) United States
(12) Reissued Patent
Cain et al.

(10) Patent Number: US RE45,885 E
(45) Date of Reissued Patent: Feb. 9, 2016

(54) LASER ABLATION OF ELECTRONIC DEVICES

(71) Applicant: Plastic Logic Limited, Cambridge, Cambridgeshire (GB)

(72) Inventors: Paul A. Cain, Cambridge (GB); Carl Hayton, Cambridge (GB)

(73) Assignee: Flexenable Limited, Cambridge, Cambridgeshire (GB)

(21) Appl. No.: 14/260,240

(22) Filed: Apr. 23, 2014

Related U.S. Patent Documents

Reissue of:

(64) Patent No.: 8,062,984
Issued: Nov. 22, 2011
Appl. No.: 12/065,722
PCT Filed: Aug. 31, 2006
PCT No.: PCT/GB2006/050265
§ 371 (c)(1),
(2) Date: Aug. 17, 2009
PCT Pub. No.: WO2007/029028
PCT Pub. Date: Mar. 15, 2007

U.S. Applications:

(63) Continuation-in-part of application No. 11/915,731, filed as application No. PCT/GB2006/050133 on May 30, 2006.

(30) Foreign Application Priority Data

| | | |
|---|---|---|
| Jun. 1, 2005 | (GB) | 0511132.3 |
| Jul. 8, 2005 | (GB) | 0513915.9 |
| Sep. 6, 2005 | (GB) | 0518105.2 |
| Nov. 14, 2005 | (GB) | 0523141.0 |

(51) Int. Cl.
*H01L 21/00* (2006.01)
*H01L 21/461* (2006.01)
(Continued)

(52) U.S. Cl.
CPC ..... *H01L 51/0023* (2013.01); *B23K 26/063* (2013.01); *B23K 26/4075* (2013.01);
(Continued)

(58) Field of Classification Search
CPC ..... B23K 26/063; B23K 2201/40; B23K 26/4075; B23K 2203/16; H01L 51/0023; H01L 21/268; H01L 21/76838; H05K 3/4644; H05K 3/027; H05K 2201/09672
USPC ..... 438/795, 690, 455, 940
See application file for complete search history.

(56) References Cited

U.S. PATENT DOCUMENTS 4,081,653 A 3/1978 Koo et al.
(Continued)

FOREIGN PATENT DOCUMENTS

EP 1 443 556 A2 * 8/2004
EP 1897157 A2 3/2008
(Continued)

OTHER PUBLICATIONS

Bao, Z., "Materials and Fabrication Needs for Low-Cost Organic Transistor Circuits" Advanced Materials 12, vol. 3, p. 227-230 (2000).
(Continued)

*Primary Examiner* — Adam L Basehoar
(74) *Attorney, Agent, or Firm* — Knobbe, Martens, Olson & Bear LLP

(57) ABSTRACT

A method of fabricating an electronic device, the device including a plurality of layers on a substrate, the layers including an upper conductive layer and at least one patterned underlying layer between said conductive layer and said substrate. The method includes patterning said underlying layer, and patterning said upper conductive layer by laser ablation using a stepwise process in which successive areas of said upper conductive layer are ablated by successively applied laser patterns. The successively applied laser patterns overlap one another in an overlap region. The method further includes configuring a said laser pattern and said patterned underlying layer with respect to one another such that in a said overlap region said patterned underlying layer is substantially undamaged by said stepwise laser ablation.

16 Claims, 14 Drawing Sheets

(51) Int. Cl.

| | |
|---|---|
| ***H01L 51/00*** | (2006.01) |
| ***B23K 26/06*** | (2014.01) |
| ***B23K 26/40*** | (2014.01) |
| ***H05K 3/02*** | (2006.01) |
| *H01L 21/268* | (2006.01) |
| *H01L 21/768* | (2006.01) |
| *H05K 3/46* | (2006.01) |

(52) U.S. Cl.

CPC ..... *H05K3/027* (2013.01); *B23K 2201/40* (2013.01); *B23K 2203/16* (2013.01); *H01L 21/268* (2013.01); *H01L 21/76838* (2013.01); *H05K 3/4644* (2013.01); *H05K 2201/09672* (2013.01)

(56) References Cited

U.S. PATENT DOCUMENTS

| | | | | |
|---|---|---|---|---|
| 4,684,437 | A | 8/1987 | Donelon et al. | |
| 5,446,521 | A | 8/1995 | Hainsey et al. | |
| 5,723,236 | A | 3/1998 | Inoue et al. | |
| 5,972,543 | A | 10/1999 | Yokoyama et al. | |
| 6,285,001 | B1 * | 9/2001 | Fleming et al. | 219/121.72 |
| 6,399,258 | B2 * | 6/2002 | O'Brien | B41M 5/262 430/17 |
| 6,719,916 | B2 * | 4/2004 | Dubowski et al. | 216/65 |
| 2001/0015438 | A1 * | 8/2001 | Callegari et al. | 257/40 |
| 2002/0102478 | A1 | 8/2002 | Hasegawa et al. | |
| 2004/0075120 | A1 | 4/2004 | Wu et al. | |
| 2004/0137142 | A1 * | 7/2004 | Nishikawa | 427/66 |
| 2004/0149986 | A1 * | 8/2004 | Dubowski et al. | 257/40 |
| 2004/0155948 | A1 * | 8/2004 | Dinca et al. | 347/104 |
| 2005/0009248 | A1 * | 1/2005 | Weng et al. | 438/149 |
| 2005/0106507 | A1 * | 5/2005 | Bernds et al. | 430/322 |
| 2005/0211975 | A1 | 9/2005 | Kawasaki et al. | |
| 2005/0279999 | A1 | 12/2005 | Lee et al. | |
| 2009/0009812 | A1 | 1/2009 | Sirringhaus et al. | |
| 2009/0212292 | A1 | 8/2009 | Hayton et al. | |

FOREIGN PATENT DOCUMENTS

| | | | |
|---|---|---|---|
| EP | 2463928 | A2 | 6/2012 |
| JP | H9-293891 | A | 11/1997 |
| JP | 10263871 | A | 10/1998 |
| JP | H11-123884 | | 5/1999 |
| JP | H11-320166 | A | 11/1999 |
| JP | 2000208794 | A | 7/2000 |
| JP | 2003133690 | A | 5/2003 |
| JP | 2003-258256 | A | 9/2003 |
| JP | 2003-309266 | | 10/2003 |
| JP | 2004-508731 | | 3/2004 |
| JP | 2004-179542 | | 6/2004 |
| JP | 2004-306127 | | 11/2004 |
| JP | 2005-081420 | | 3/2005 |
| JP | 2005-509298 | | 4/2005 |
| WO | WO 98/53510 | | 11/1998 |
| WO | WO 99/10939 | | 3/1999 |
| WO | 01/47043 | | 6/2001 |
| WO | 03/080285 | | 2/2003 |
| WO | 03/041185 | | 5/2003 |
| WO | WO 2004/060600 | | 7/2004 |
| WO | WO 2004/060600 | A | 7/2004 |

OTHER PUBLICATIONS

Duan, X., "High performance thin film transistors assembled from semiconductor nanowires and nanoribbons " Nature 425, 274-278 (2003).

Extended Search Report for EP Application No. 12157149.1 dated May 22, 2014 in 10 pages.

Jolic, et al., "Fabrication of three-dimensional inductor coil using excimer laser micromachining." Journal of Micromechanics and Microengineering, Institute of Physics Publishing, 13(5):782-789 (Sep. 1, 2003).

Katz, H.E., "Organic molecular solids as thin film transistor semiconductors," J. Mater. Chem. vol. 7, Issue 3, p. 369-572 (1997).

Laquindanum, J.G. et al., "Synthesis, Morphology, and Field-Effect Mobility of Anthradithiophenes" J. Am. Chem. Soc. 120, p. 664-672 (1998).

Haight, et al., "Femtosecond laser ablation and deposition of metal films on transparent substrates with applications in photomask repair", Proceedings of SPIE, vol. 5714, Mar. 21, 2005, pp. 24-36, XP055116749.

Schrodner, et al., "Polymer field effect transistors made by laser patterning", Organic Electronics, Elsevier, Amsterdam, vol. 6, No. 4, May 31, 2005, pp. 161-167, XP027680009.

Communication pursuant to Article 94(3) EPC issued on Apr. 12, 2013 for European Application No. 06 779 619.3.

Notice of Reasons for Rejection issued on Aug. 7, 2012 for Japanese Patent Application No. 2010-529697.

International Preliminary Report on Patentability issued on Oct. 6, 2009 for International Application No. PCT/GB2006/050133.

Communication pursuant to Article 94(3) EPC issued on Feb. 16, 2010 for European Application No. 06 7744 335.8-2203.

Decision to Refuse a European Patent Application issue on Jul. 16, 2013 for European Application No. 06 744 335.8-1552.

Search Report under Section 17(5) issued on Nov. 9, 2005 for Patent Application GB 0513915.9.

Office Action issued on Nov. 2, 2010 for Chinese Application No. 200680028267.5.

Notice of Reasons for Rejection issue on Jul. 3, 2012 for Japanese Patent Application No. 2008-514206.

Office Action issued on Feb. 13, 2013 for Korean Application No. 10-2007-7028115.

International Search Report mailed Sep. 24, 2009 for International Application No. PCT/GB2006/050133.

Examination Report mailed Nov. 30, 2011 for European Application No. 06744335.8.

Annex to Summons mailed Mar. 7, 2013 for European Application No. 06744335.8.

Decision of Rejection mailed Jan. 22, 2013 for Japanese Application No. JP2008-514206.

Notice of Reasons for Rejection mailed Mar. 4, 2014 for Japanese Application No. JP 2012-281399.

Hosokawa, et al., "Femtosecond Multistep Laser Etching of Transparent Amorphous Organic Film", Japanese Journal of Applied Physics, Japan Society of Applied Physics, Tokyo JP, vol. 40, No. 10B, Part 2, Oct. 15, 2001, pp. L1116-L1118, XP001111222, ISSN: 0021-4922.

Noach, et al., "Microfabrication of an electroluminescent of polymer light emitting diode pixel array", Applied Physics Letters, AIP, American Institute of Physics, Melville, NY,vol. 69, No. 24, Dec. 9, 1996, p. 3650, XP012016774, ISSN: 0003-6951.

English Translation of Chinese Office Action mailed on Oct. 29, 2012 for Chinese Application No. 2006-800282675.

Ghandour et al., "Excimer ablation of ITO on flexible substrates for large format display", pp. 90-101, Proceedings 2002 SPIE, Photonics West.

Wu et al., "Single-shot Excimer Laser Ablation of Thick Polymer Resists on Metallic Substrates", AMP Journal of Technology, vol. 1, pp. 69-79, Nov. 1991.

Schaefer et al., "Ablation of PEDOT/PSS with excimer lasers for micro structuring of organic electronic devices," Synthetic Metals 161 (2011) pp. 1051-1057.

Basting, "Excimer Laser Technology Laser Sources, Optics, Systems and Applications" Lambda Physik, 2001 p. 151.

Musaev, et al., "UV laser ablation of parylene films from gold substrates," National Nuclear Security Administration's Kansas City Plant, Department of Physics, University of Missouri—Kansas City, Kansas City, in 15 pages, 2011.

Aug. 31, 2006 International Preliminary Report on Patentability for PCT/GB2006/050265.

Bao, Z. et al., "High Performance Plastic Transistors Fabricated by Printing Techniques," Chem. Mat. 9, 1299-1301 (1997).

Brittain, S. et al., "Soft Lithography and Microfabrication" Physics World, vol. 11, No. 5, p. 31, (May 1998).

(56) References Cited

OTHER PUBLICATIONS

Kagan, C.R. et al., "Organic-Inorganic Hybrid Materials as Semiconducting Channels in Thin-Film Field-Effect Transistors" Science 286, No. 5441, p. 946 (1999).
International Search Report issued in application No. PCT/GB2006/050265 on Nov. 27, 2006.
Ridley, B.A. et al., "All-Inorganic Field Effect Transistors Fabricated by Printing" Science 286, No. 5440, p. 746-749 (1999).
Rogers, J.A. et al., "Low-Voltage 0.1 pm organic transistors and complementary inverter circuits fabricated with a low-cost form of near-field photolithography," Appl. Phys. Lett. 75, No. 7, p. 1010 (1999).

* cited by examiner

LASER ABLATION OF ELECTRONIC DEVICES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is the U.S. National Phase under 35 U.S.C. §371 of International Application No. PCT/GB2006/050265, filed Aug. 31, 2006, designating the United States and published in English on Mar. 15, 2007, as WO 2007/029028, which claims priority to United Kingdom Application No. 0518105.2, filed Sep. 6, 2005 and United Kingdom Application No. 0523141.0, filed Nov. 14, 2005.

FIELD OF THE INVENTION

The present invention relates to methods of fabricating electronic devices using laser ablation and to devices fabricated thereby. Embodiments of the methods are particularly suitable for defining electrodes within thin film transistor (TFT) structures using laser ablation in a step-and-repeat mode.

DESCRIPTION OF RELATED ART

A route for achieving cost-effective electronics such as large-area displays and RFID circuits at higher throughputs than are available using conventional inorganic semiconductor wafer processing is required within organic electronics. In order to achieve devices such as large area displays and high-speed logic circuits, conduction pathways in the form of electrodes and interconnects are required on more than one level within the device stack. In order to achieve the required conductivity for the conduction pathways, metallic conductive layers are often necessary.

However, in comparison with conventional inorganic semiconductor wafer processing, there are no known methods within organic electronics of providing metallic conductivity pathways on flexible substrate with high resolution (<10 μm) and without using a high temperature process step (<80° C.) at higher throughput than can be achieved with conventional photolithography. Various known processes satisfy some but not all of these requirements. For example, the technique of ink jet printing metal nano-particle solutions followed by laser annealing achieves high conductivity at low temperature, but is only capable of low resolution and low throughput. Similarly, the technique of thermal transfer printing has reasonably high resolution (~10 μm) and low process temperature but usually yields low conductivity or low throughput.

A known method of patterning layers of a device, such as the conductive layers described above, is the use of pulsed lasers to ablate regions of a deposited layer, or to delaminate one thin layer of material from the surface of a usually thicker, second layer of a different material. For these techniques, most commonly a nano-second pulse-length laser such as a pulsed Excimer laser is used.

Background prior art can be found in: US2005/0009248; EP1443556A; US2001/0015438; and US2004/0137142.

Embodiments of the invention aim to provide a method of fabricating thin film transistor (TFT) structures by forming gate and other electrodes and interconnect lines by laser ablation in a step-and-repeat fashion. In this mode a region of the substrate is exposed to the laser radiation, for example with a pattern defined by an optical mask, and the layer to be patterned is ablated. Then the sample is moved to another location with respect to the mask pattern projected onto the sample, and another ablation exposure occurs to pattern the layer in an adjacent region. In this method to completely pattern the layer on the substrate it is necessary to define overlap regions where the substrate is exposed to the laser radiation in more than one step. This overlap region typically has lateral dimensions on the order of several 1-10 μm. For example, to ensure isolation of gate or interconnect lines when imaging an entire panel in step-and-repeat mode, the masks of neighbouring imaging regions must be slightly overlapped along the axis of the gate line interconnects, so that no thin traces of metal remain connecting parallel running interconnect lines after laser ablation.

This is a particularly important issue for manufacturing on flexible substrates, since by adjusting the region of overlap between subsequent laser exposures, correction for distortion of a pattern on the underlying substrate can be achieved. For example, in a top-gate TFT configuration on a flexible substrate the source-drain pattern defined on the substrate might exhibit some distortion because the substrate might have changed dimension due to thermal or mechanical stress in between processing steps. Mien defining the gate pattern, which needs to overlap accurately with the source-drain pattern, it is possible to correct for this distortion by measuring the position of the source-drain pattern on the substrate and adjusting the position of the substrate with respect to the laser-exposed area, and the width of the overlap region with a previous shot, to correct for this substrate distortion, and ablate the gate pattern in good registration with respect to the source-drain pattern. Such a distortion compensation scheme typically increases the width of the overlap region which is required, since it preferably should be wide enough to accommodate the maximum possible distortion which is possible on the length scale of the size of substrate area exposed in a single laser shot.

One of the key problems that arise in this mode is that in the overlap region the ablation characteristics and amount of ablated material is different from that in the regions, which are only exposed to a single shot. An electronic device typically contains a multilayer structure of conducting, semiconducting and dielectric layers. To pattern, for example, the gate electrodes in a top-gate TFT configuration it is necessary, to adjust and optimise the laser power to ablate selectively only a certain layer of the stricture (the gate metal layer), but to leave other layers of the structure (the source-drain electrode pattern, active semiconducting and gate dielectric layers intact. Work was conducted to pattern a conductive, upper layer of an active electronic device by a single-shot laser exposure which selectively removes form the substrate the conductive layer, but does not affect any of the underlying active layers of the device. However, if a step-and-repeat process is used with this technique to pattern an area of the substrate larger than that which can be exposed in a single shot, in the overlap region the amount of deposited energy is more than twice that deposited in the single-shot regions, and, therefore, undesirable ablation of material in other layers of the structure occurs.

A damaging perimeter effect commonly observed, particularly during processes of ablation of metallic layers, is a burring edge effect around the ablation site, caused by molten material reforming at the edges of the ablation site with the substrate material, due to thermal dissipation. This may cause serious device performance issues within electronic devices, particularly when attempting to accurately define fine structure features of an electronic device by laser ablation, such as the source and drain electrodes of a thin film transistor (TFTs). For example, the burring edges may rise through the overlying layers of the device to cause electrical shorts.

SUMMARY OF THE INVENTION

According to the present invention there is therefore provided a method of fabricating an electronic device, the device comprising a plurality of layers on a substrate, the layers including an upper conductive layer and at least one patterned underlying layer between said conductive layer and said substrate, the method comprising: patterning said underlying layer; and patterning said upper conductive layer by laser ablation using a stepwise process in which successive areas of said upper conductive layer are ablated by successively applied laser patterns; wherein said successively applied laser patterns overlap one another in an overlap region; and wherein said method further comprises configuring a said laser pattern and said patterned underlying layer with respect to one another such that in a said overlap region said patterned underlying layer is substantially undamaged by said stepwise laser ablation.

In one embodiment of the method, the upper conductive layer is patterned so that in the overlap region, material of the underlying layer is substantially absent. In this way, although there may be some damage due to double exposure in the overlap region, the burring edge effect, of for example an underlying metal layer, can be avoided.

In preferred embodiments the electronic device has a plurality of layers and the underlying layer is also conductive, separated from the upper conductive layer by at least one dielectric layer. In general the upper conductive layer will not be the topmost layer of the device since, for example, other overlying dielectric and/or protective layers or coating will also be present.

In a preferred embodiment of the method, the device comprises a display device and the underlying conductive layer is used to define a plurality of electrode lines, each with an adjacent stripe substantially free of conductive material (at the underlying layer level). This facilitates using a laser ablation in a step-and-repeat mode, in which the same pattern is stepped across the device for each laser ablation exposure.

In a different, related embodiment, at least one of the two overlapping laser patterns is configured to leave the upper conductive layer substantially unablated in parts of the overlap region, beneath which material of the patterned underlying layer is present. Optionally both of the overlapping laser patterns may be configured to leave parts of the overlap region covering the patterned underlying layer material, substantially in tact. In such embodiments a region of the upper conductive layer is left over the parts of the underlying layer that remain after patterning and these upper conductive layer regions can be thought of as "sacrificial" regions. It will be appreciated that in these embodiments the two overlapping patterns in general comprise different patterns, each of which may be defined by a respective sub-field mask.

Some preferred versions of the above-described embodiments further comprise compensating for distortion of the substrate by adjusting positions of the successively applied laser ablation patterns and/or of the substrate. Details of some techniques, which may be employed to map the substrate distortion for use in a distortion compensation scheme, are described in the Applicant's co-pending UK Patent Application No. GB0506613.9 filed 1 Apr. 2005 and claiming priority from GB30426126.9 filed 29 Nov. 2004, the relevant contents of which are hereby incorporated by reference in their entirety.

In some preferred embodiments of the method the device comprises a thin film transistor (TFT), and one of the underlying layer and upper conductive layer comprises a source-drain layer of the TFT, the other a gate layer of the TFT (either a top-gate or a bottom-gate configuration may be employed). Preferably the device comprises an organic or molecular electronic device. Embodiments of the method are particularly suitable for fabricating such a device on a flexible substrate such as a plastic substrate, for example a thin sheet of polyethyleneterephthalate (PET) or polyethylenenaphthalate (PEN).

In some preferred embodiments the laser ablation comprises single-shot laser ablation, for example using an ultraviolet laser such as an Excimer laser (248 nm). The pulse length of a typical Excimer laser is in the region of 30 ns, but in some embodiments of the method the use of shorter duration laser pulses can achieve improved results, for example pulses of less than 10 ns or less than Ins duration. Such techniques are described in more detail in the Applicant's co-pending UK Patent Application No. GB0513915.9 filed 8 Jul. 2005 and claiming priority from GB0511132.3 filed 1 Jun. 2005, the entire contents of which are hereby incorporated by reference. For such techniques, preferably the upper conductive layer has an optical density (at a wavelength of the laser ablation) of at least 0.5, preferably at least 1.0.

The invention further provides a thin film transistor (TFT) active matrix display sensing device and logic circuit fabricated by a method as described above, in particular by any of the preferred embodiments of the described method.

Thus we describe a technique for using a short pulse laser beam to selectively pattern an initial blanket layer of metal into gate lines and other electrodes or interconnects, using a step-and-repeat ablative process that leaves important underlying layers intact, most notably the metallic source-drain layer, and avoids device degradation and failure by ablation of metallic material from lower levels, particularly in the overlap region between subsequent laser exposures.

According to a first general embodiment of the present invention a method is therefore disclosed for designing a circuit pattern for a step-and-repeat laser ablation process on an upper level of the device, wherein the pattern of conducting or semiconducting structures on a lower level of the device is designed in such a way that in the region of overlap between subsequent laser exposures, no conducting electrode or interconnect structure is present in the underlying layers. In this way the removal of underlying metal structure by laser ablation in the region of overlap is prevented.

For example, in the case of an active matrix display it is possible to lay out the pixel TFT circuits in such a way that on the lower substrate level containing the data lines (top-gate configuration) or addressing lines (bottom gate configuration) there is a narrow stripe running parallel to the data and addressing lines, respectively, which can be free of metal pattern. The overlap region between subsequent exposure steps for the laser ablation on an upper electrode level can be positioned to lie within this metal-free region of the underlying substrate pattern.

In the regions, which are exposed to a single-shot dose, and contain underlying metal patterns, care also needs to be taken to avoid damage or ablation of the lower conductive layer during the laser ablation process of the upper layer. The structure is constructed in the following way: the thickness of the upper conductive layer is chosen to be below 150-200 nm in order to allow ablation in a single shot, but sufficiently thick such that the optical density of the upper conductive layer is sufficiently high to shield any of the radiation sensitive layers in lower layers from the laser light, and to keep the energy density absorbed in any of the lower layers below their respective ablation thresholds. Preferably, the upper conductive layer is thicker than 10 nm, and its optical density at the wavelength of the laser is preferably higher than 0.5 and most preferably higher than 1.

The pulse fluence is selected to be above the ablation threshold for the upper layer, but below the damage threshold of any of the lower layers. As an example, consider a 50 nm upper layer of Gold, which has an optical density of about 4. A 100 mJ $cm^{-2}$ spatially uniform (within 10%) laser pulse is then fired at the gold layer (248 nm, 30 ns laser pulse) from an Excimer laser. This is well above the ablation threshold (delamination threshold) for the gold. Up to the point in time of ablation of the gold layer, nearly all of the laser energy is absorbed in the upper gold layer, since the optical density is so high (in the order of 4). The underlying dielectric layer is heated but is not ablated. In order to avoid damage to the underlying layer it is also advantageous to select the top conductive layer/underlying substrate combination such that they exhibit relatively poor adhesion, for example, in the case of a layer of gold, by deposition onto a layer of polymer.

In the case of a more complex and less periodic circuit pattern it might not always be possible to lay out the circuit in such a way that the overlap region for laser exposure is free of metal structures in the underlying layers.

According to a second general embodiment of the present invention, a method is disclosed for designing a circuit pattern for a step-and-repeat laser ablation process on an upper level of the device, wherein the mask pattern for defining the conducting or semiconducting structures on the upper level includes "sacrificial" structures at the edge of the field of laser exposure, which block laser exposure in portions of the overlap regions in which metal structures on the lower level cross through the overlap region. In this way the removal of underlying metal structure by laser ablation in the region of overlap can be substantially prevented.

BRIEF DESCRIPTION OF THE DRAWINGS

To help understanding of the invention, specific embodiments thereof will now be described by way of example and with reference to the accompanying drawings, in which.

DETAILED DESCRIPTION OF PREFERRED EMBODIMENTS

Broadly speaking we will describe a method of producing an electronic device on a substrate comprising at least one patterned layer, wherein the step of patterning of said layer comprises removing material form the substrate by laser ablation in a step-and-repeat fashion without ablation or degradation of underlying layers.

EXAMPLE 1

Step-and-Repeat Laser Ablation of Regular Device Arrays

An example is disclosed to ablate material within upper layers of a multi-layer device structure in order to create gate line isolation. The method utilizes a technique of laser ablation to remove material within a large area and realize a high resolution, high conductivity and high throughput process at a low temperature. The ablation region is formed by a mask that is moved in a step-and-repeat manner to adjacent positions on the substrate where the ablation process is then repeated. In order to ensure that no metal is unintentionally left on the upper layer in between masks, a region of overlap between adjacent masks is created referred to here as the stitching region. The prevention of radiation degradation of the underlying layers within this two-shot overlap area is achieved by positioning the overlap area between the pixel and the source line in a region where there is no gold present on the lower layer.

Figure 1:
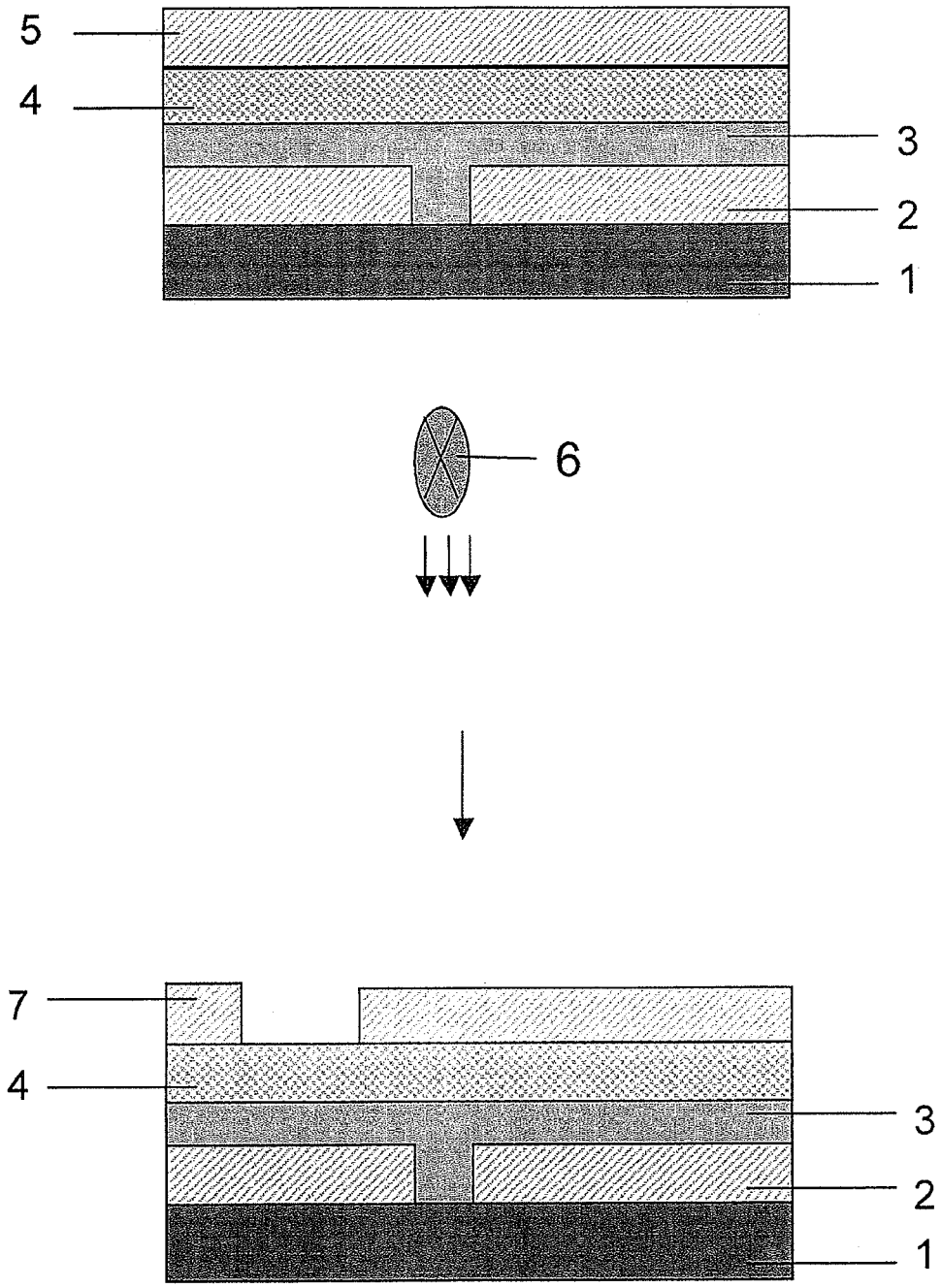
FIG. 1 shows a fabrication process of a multi-layer stack for polymer-based printed TFTs.

The fabrication of a multi-layer stack for polymer-based printed TFTs is conducted according to FIG. 1. Conductive material is deposited and patterned on a substrate 1 to form source and drain electrodes 2. The substrate may be either glass or a polymer film, but preferably a plastic substrate such as polyethyleneterephthalate (PET) or polyethylenenaphthalene (PEN) is used. The patterned conductive layer 2 comprises a conducting polymer, such as PEDOT, or a metallic material, such as gold, silver, copper or aluminium. It may be deposited and patterned through solution processing techniques such as, but not limited to, spin, dip, blade, bar, slot-die, or spray coating, inkjet, gravure, offset or screen printing. Alternatively, vacuum deposition techniques may be used, such as evaporation and sputtering as well as photolithographic patterning techniques.

Once the conductive layer has been patterned to form the source and drain electrodes, a layer of semiconducting material 3 may then be deposited over the substrate and patterned electrodes. The semiconducting layer may comprise materials such as, but not limited to, polyarylamine, polyfluorene or polythiophene derivatives. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat, 9, 12999 (1997)), offset printing, blade coating or dip coating, curtain coating, meniscus coating, spray coating, or extrusion coating. Alternatively, the semiconducting layer may be deposited as a thin continuous film and patterned subtractively by techniques such as photolithography (see WO 99/10939) or laser ablation.

A layer of gate dielectric material 4 is then deposited onto the layered substrate. Materials such as polyisobutylene or polyvinylphenol may be used as the dielectric material, but preferably polymethylmethacrylate (PMMA) and/or polystyrene are used. The dielectric material may be deposited in the form of a continuous layer, by techniques such as, but not limited to, spray or blade coating. However, preferably, the technique of spray coating is used.

The deposition of the dielectric layer is then followed by the deposition of a gate electrode 5 and interconnect lines. The material of the gate electrode may be a thin film of inorganic metal such as gold or a cheaper metal such as copper or aluminium. The gate electrode is deposited using techniques such as sputtering or evaporation techniques or solution processing techniques such as spin, dip, blade, bar, slot-die, gravure, offset or screen printing. Alternatively electroless plating techniques maybe used. The selective ablation process described below is more easily achieved for thin layers of metal than for thick layers. However, in many cases a minimum layer thickness is required in order to reach the necessary conductance. A thickness of 50 nm provides the necessary conductance for a range of applications, including gate interconnections for flat panel displays.

The metallic layer 7 is preferably ablated using a 248 nm Excimer laser 6, although other wavelengths can be used as well. A laser, such as a Lumonics PM800 lasers (300 mJ, 30W) may be used. A mask is positioned over the layered substrate to create the ablation region. The upper layer of the preferred gold material within the ablation region is removed upon firing a single shot from the laser, substantially without any damage to the underlying metallic layers or the dielectric layer and in addition, very little debris. The ablation region is large when only a single shot is fired. A range of fluence from 28 to 112 mJ $cm^{-2}$ may be used to remove the upper gold layer without any apparent damage to the underlying layers. This results in a clean process without the formation of excess debris. This range of fluence is related to the absorption coefficient, thickness and adhesion of the upper metal layers.

Figure 2:
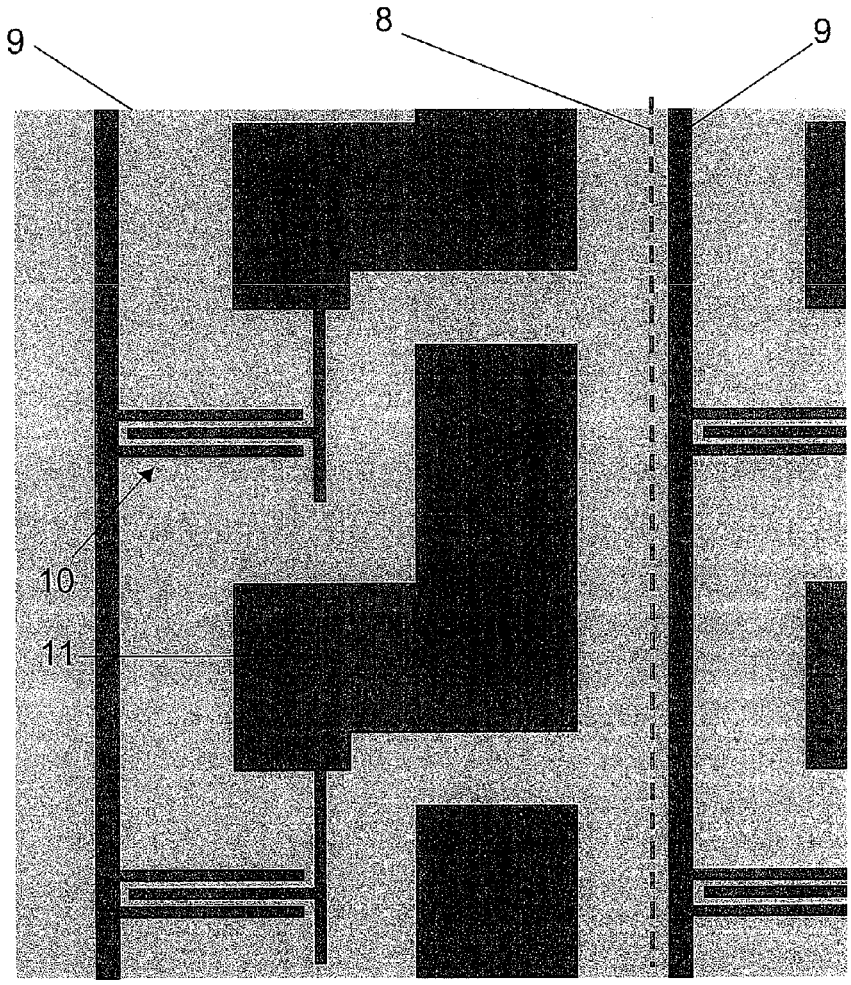
FIG. 2 shows positioning of an overlap region of two adjacent masks, in-between a pixel electrode and a source line, where there is no underlying metallic material.

The mask is repositioned to an adjacent position along the substrate. In order to ensure that no gold is remaining after the ablation process of the upper layer, when the mask is moved, it is positioned such as to overlap with the previously ablated region. The ablation process is repeated in the new laser exposure region of the substrate. However, the region of overlap will now be exposed to two shots of the laser beam. In embodiments of the invention, therefore, the overlap region is positioned such that no highly absorbing layers, in particular no gold patterns in underlying layers on the source and drain level are present in the overlap region. Referring to FIG. 2, in the case of an active matrix display pattern this can be achieved by positioning the overlap region 8 in between the pixel and an electrode line such as the source line, where there is no underlying gold material. The positioning of the overlap region, in FIG. 2, is adjacent to the source line 9. The transistor 10 and the pixel electrode 11 may also be seen in FIG. 2.

Figure 3:
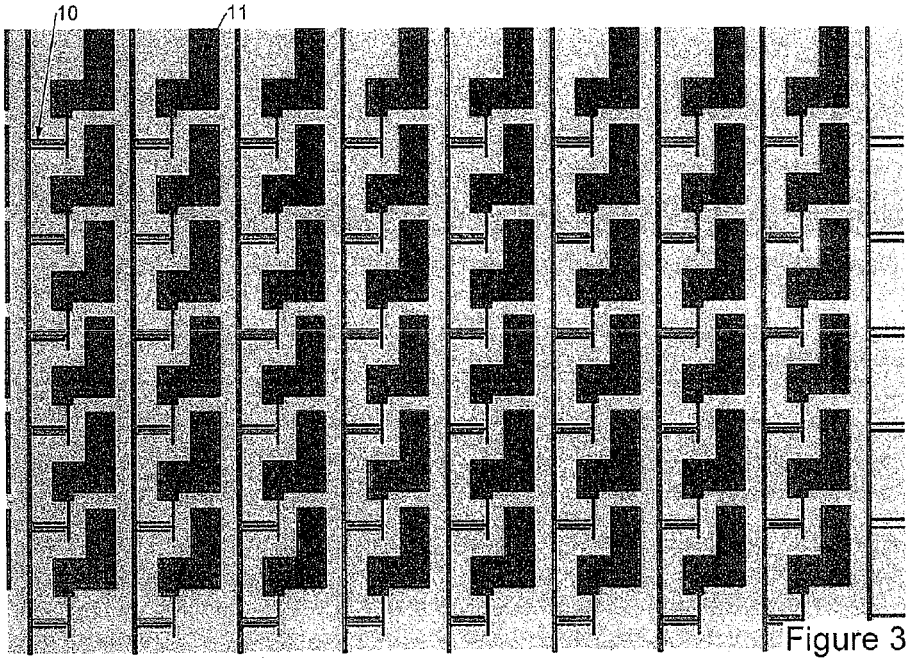
FIG. 3 shows a schematic of a source-drain pattern of an active matrix TFT array before gate patterning by laser ablation.
Figure 4:
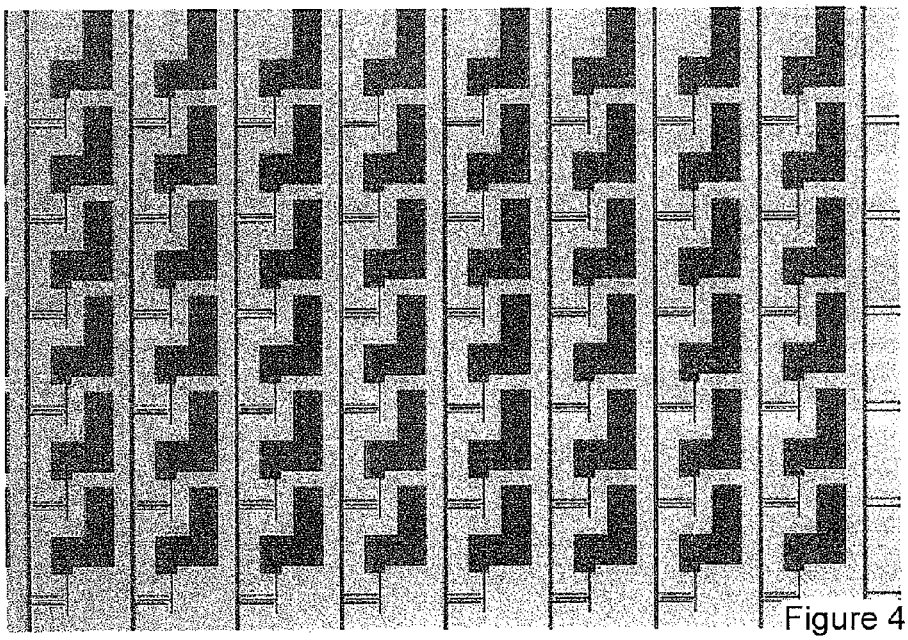
FIG. 4 shows a schematic of a processed panel after a layer of a preferred conductive material is deposited over a prepared substrate.

This laser ablation process may be used to image an entire panel in the way described above. A standard substrate is used and is prepared using the processing techniques described above, up to and including the deposition of the dielectric material. A schematic of the processed panel before ablation is shown in FIG. 3. A layer of the preferred conductive material is then deposited over the prepared substrate. Preferably, a 50 nm of gold material is then sputtered over the substrate surface, to form a layer of gold. The result of this process is shown in FIG. 4.

The mask is positioned on the substrate and using a rectangular laser spot of dimensions, such as 508 μm×394 μm, a single pulsed laser shot may be fired through the ablation region created by the mask. The mask is then repositioned 500 μm along the substrate adjacent to the previous ablation region with a 8 μm overlap with the previous region, and the laser ablation process is repeated. This results in a gate line width after ablation in the region of 106 μm. After the imaging process, the gate lines will be isolated. Due to the positioning of the overlap region, no damage can occur to the underling gold layer because of the absence of gold features on the source-drain level in the overlap region. This is demonstrated in FIG. 5a.

Figure 5A:
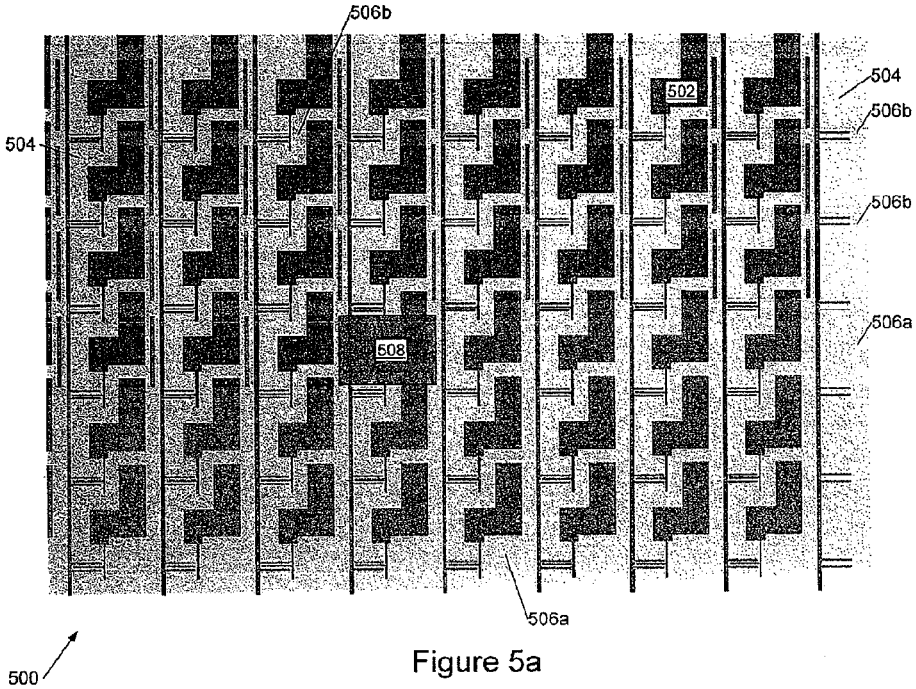
FIG. 5 demonstrates the formation of an isolated gate line that results after a laser ablation process is repeated through a mask, 5 (a) with an ablation region of 500 μm, and 5 (b) using a much larger mask size.

Referring to FIG. 5a, this shows a PET substrate 500 bearing a lower gold layer 502 with a dielectric stack 504 deposited over the underlying active layers of the device. Ah upper deposited gold layer is present, uniform 506a before ablation, and in striped regions 506b after ablation. The figure shows removal of material from the upper gold layer of the device. In this example a rectangular laser spot 508 is used (in the illustrated example, with dimensions 508 μm×394 μm). The rectangular homogenised pulsed laser is moved across the surface of the layered substrate to remove regions of the upper gold layer (which here results in a width of gate region 506b after ablation of approximately 106 μm).

Figure 5B:
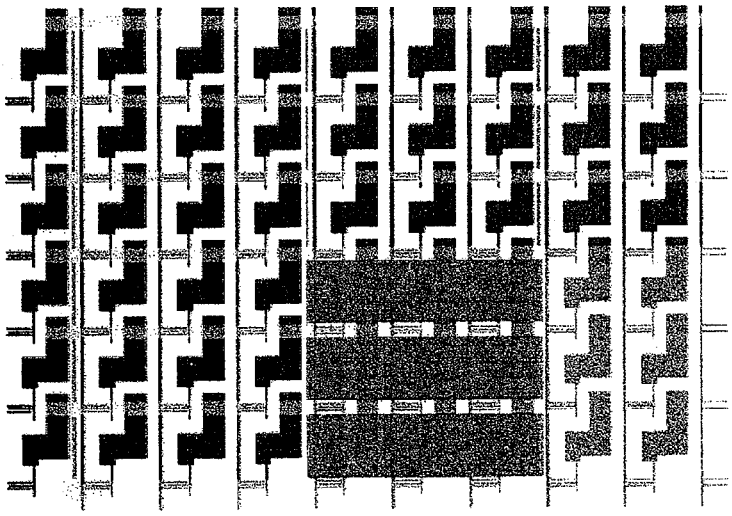

The schematic in FIG. 5a shows the ablation region as a 500 μm window—covering just a single pixel. However, depending on the size of the laser beam, a much larger-mask size and therefore ablation region may be used, for example a 3×3 pixel array. This is illustrated in FIG. 5b.

Figure 6:
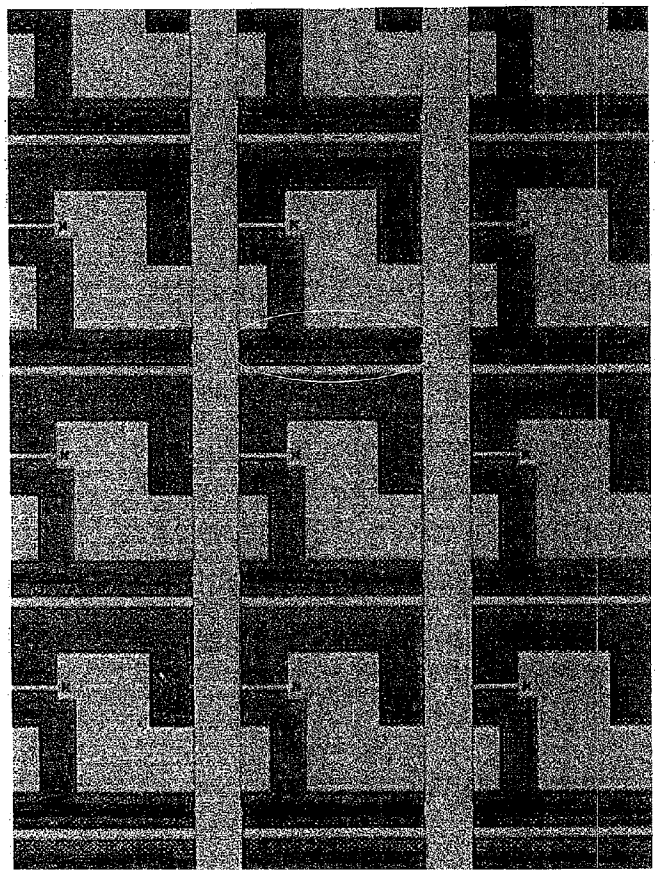
FIG. 6 shows an example of a patterned 50 dpi panel, using a fluence of 94 mJ $cm^{-2}$.

FIG. 6 shows an example of a 50 dpi panel patterned, using a fluence of 94 mJ $cm^{-2}$ to ablate a 50 nm gold layer. Ordinarily, this fluence would be sufficient to ablate the underlying layer of gold in the overlap region (example ringed in the Figure) if the upper layers of the substrate were not present. A thicker gold layer on the source and drain level would increase the ablation threshold and further reduce the risk of degradation to the underlying gold layer.

An advantage of this technique is that it is able to overcome distortions over large areas of a panel. A typical width of the two-shot overlap region is 10 μm and the step-and-repeat distance of the laser system between subsequent exposures is 5000 μm. For the given width of overlap region, even with a complex (i.e. non-rectangular) mask shape, it is therefore possible to correct for substrate distortions up to approximately 1 μm/500 μm by simply adjusting the position of the next exposure area, and/or increasing/decreasing the width of the overlap region. In our case typical substrate distortions on PET substrates were measured to be on the order of 1 μm/2000 μm, i.e. can be easily compensated for with a 10 μm wide overlap region.

Figure 7A:
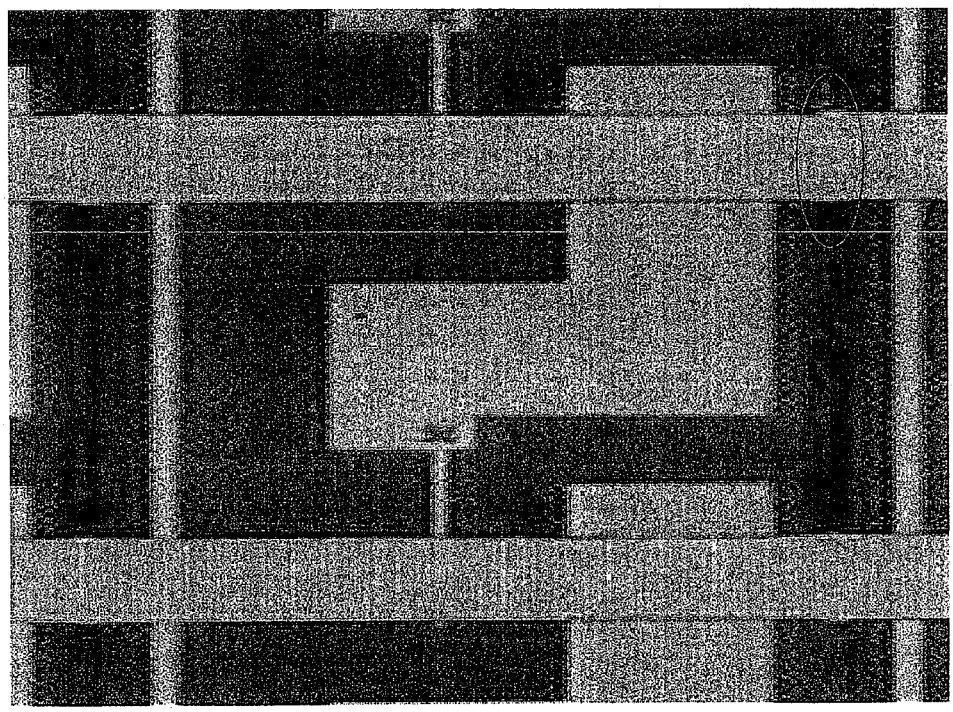
FIGS. 7 (a) and (b) shows formation of two gate lines on a panel demonstrating a kink in the upper gate line.
Figure 7B:
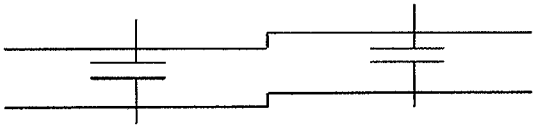

FIG. 7 a shows two gate lines, where a lateral distortion correction (perpendicular to the longitudinal step-and-repeat direction) has occurred. A slight kink in the gate line at the position indicated by the circle reflects a small shift of the exposure region on the right in order to compensate for a distortion of the source-drain pattern on the underlying layer. The relationship between the distortion of the source-drain pattern and the distortion correcting gate pattern is shown more clearly in an expanded view in FIG. 7b.

Figure 8:
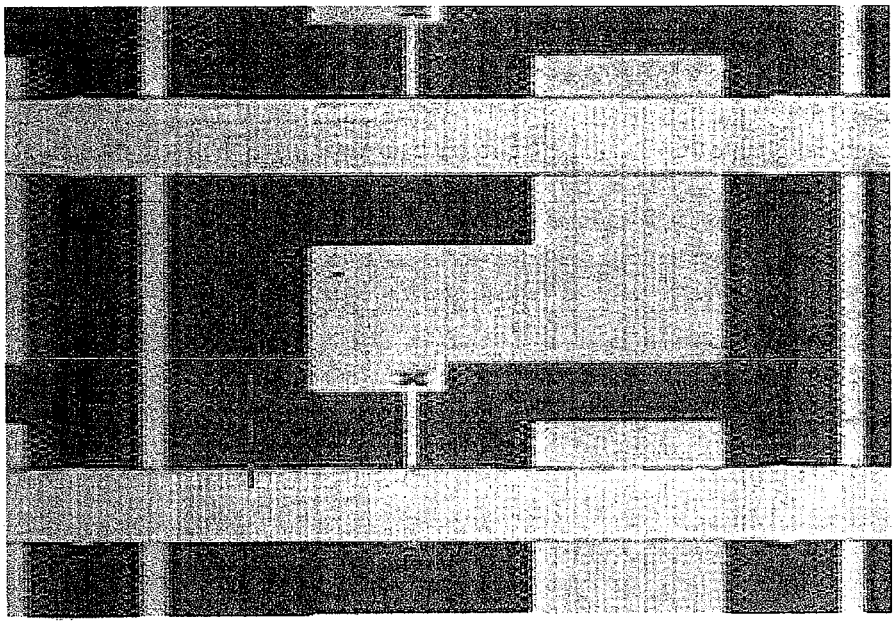
FIG. 8 shows an Atomic Force Microscopy (AMM) image taken after ablation of a gold layer, over the edge of an ablated region.
Figure 8:
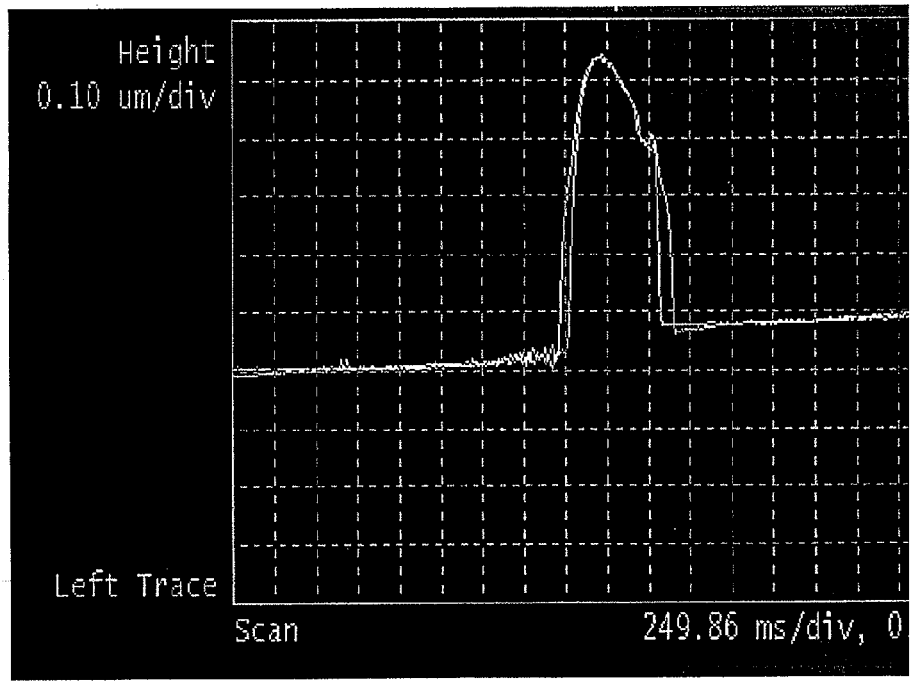

FIG. 8 shows an Atomic Force Microscopy (AFM) image, which was taken after the ablation of the gold layer under the above stated conditions. The AFM cross section was measured across the edge of the ablated region as indicated by the dashed line in FIG. 8 (top). The step height equals the thickness of the gold layer (40 nm), indicating that no underlying dielectric material was removed during the one shot ablation process. At the edge of the gold line a large burring region is seen as (the peak in the Figure) would be expected and as is discussed above.

Figure 9:
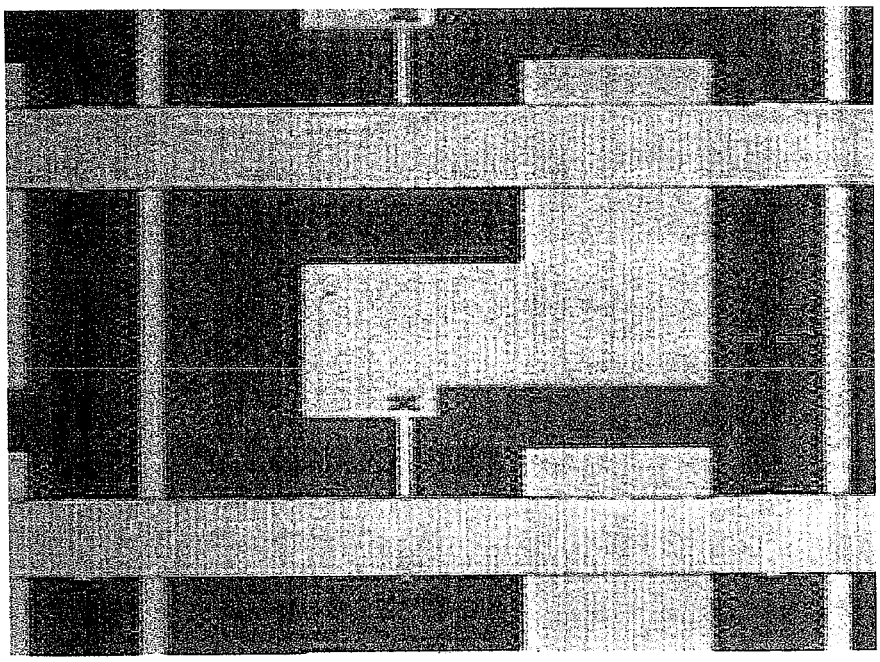
FIG. 9 shows an Atomic Force Microscopy (AFM) image taken over the edge of a two shot overlap region.
Figure 9:
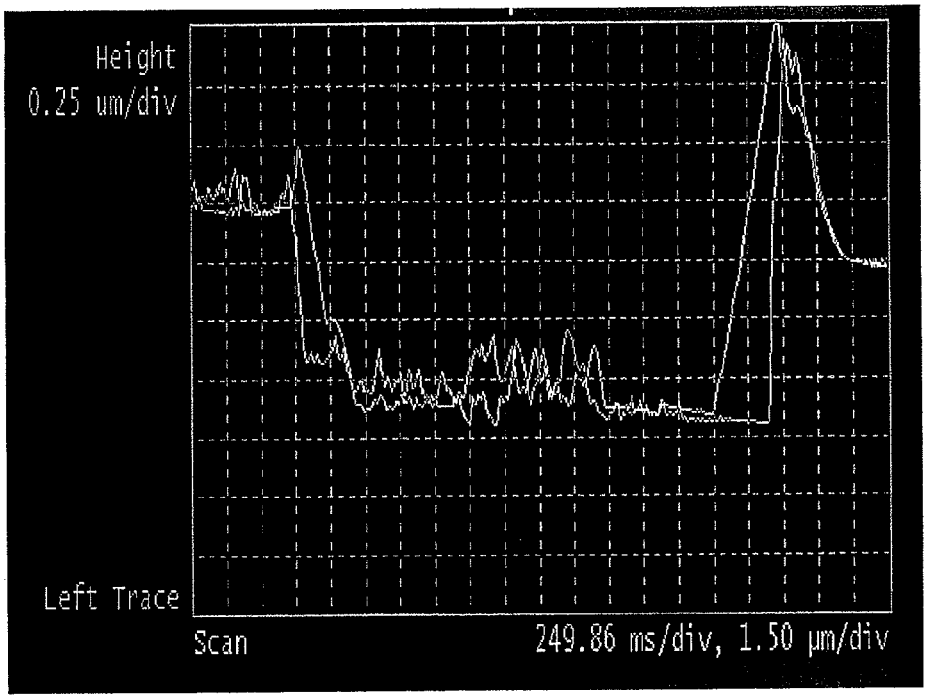

FIG. 9 shows an A-FM image taken over the edge of a two shot overlap region. The conditions are the same as for the one shot AFM discussed above. It can be seen that all of the dielectric stack material has been removed by the shot from the laser beam at 94 mJ $cm^{-2}$, i.e. a groove extending approximately to the underlying substrate depth has been created in the overlap region. If any gold pattern had been presented on the source-drain level, this pattern would have been damaged in the overlap region leading potentially to electrical shorting to the gate layer, broken interconnections at the source-drain level, and other damage causing device failure.

Figure 10:
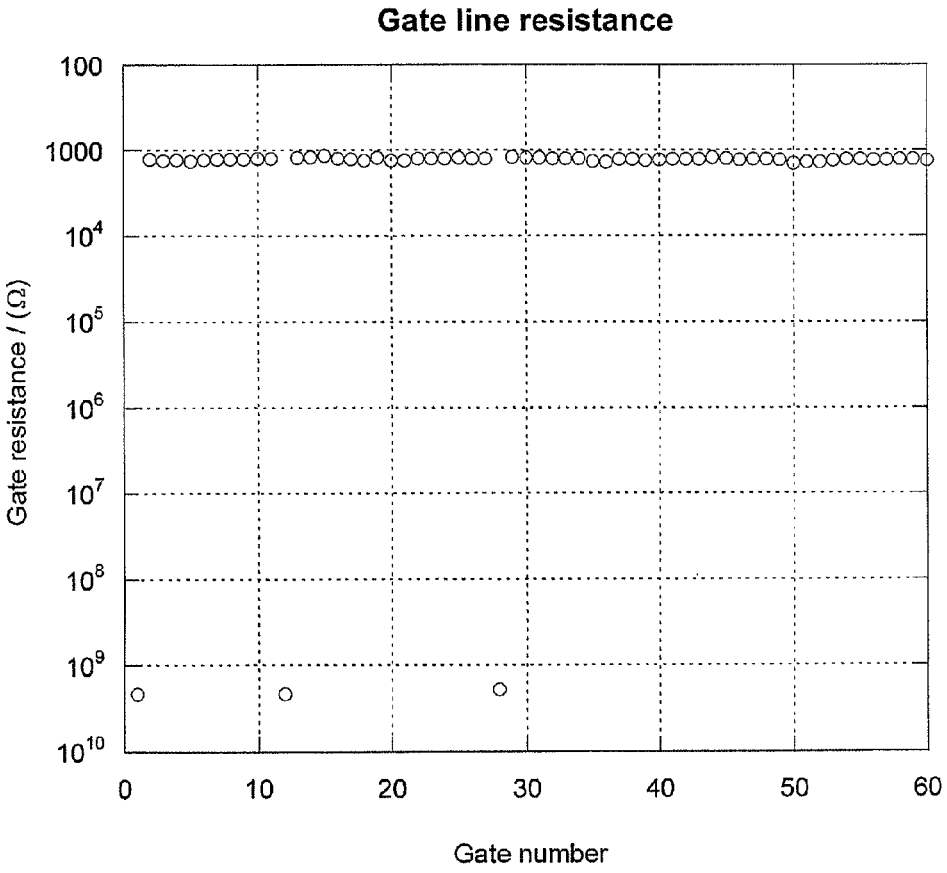
FIG. 10 illustrates line conductivity measurements that show good interline isolation was obtained using a laser ablation process according to an embodiment of the invention.

Line conductivity measurements that are seen in FIG. 10, show that good interline isolation was obtained using the above described laser process. However, higher conductivities may be produced by increasing the gold thickness (or width), to within the region of 100 nm, while still obtaining good ablation results.

Figure 11:
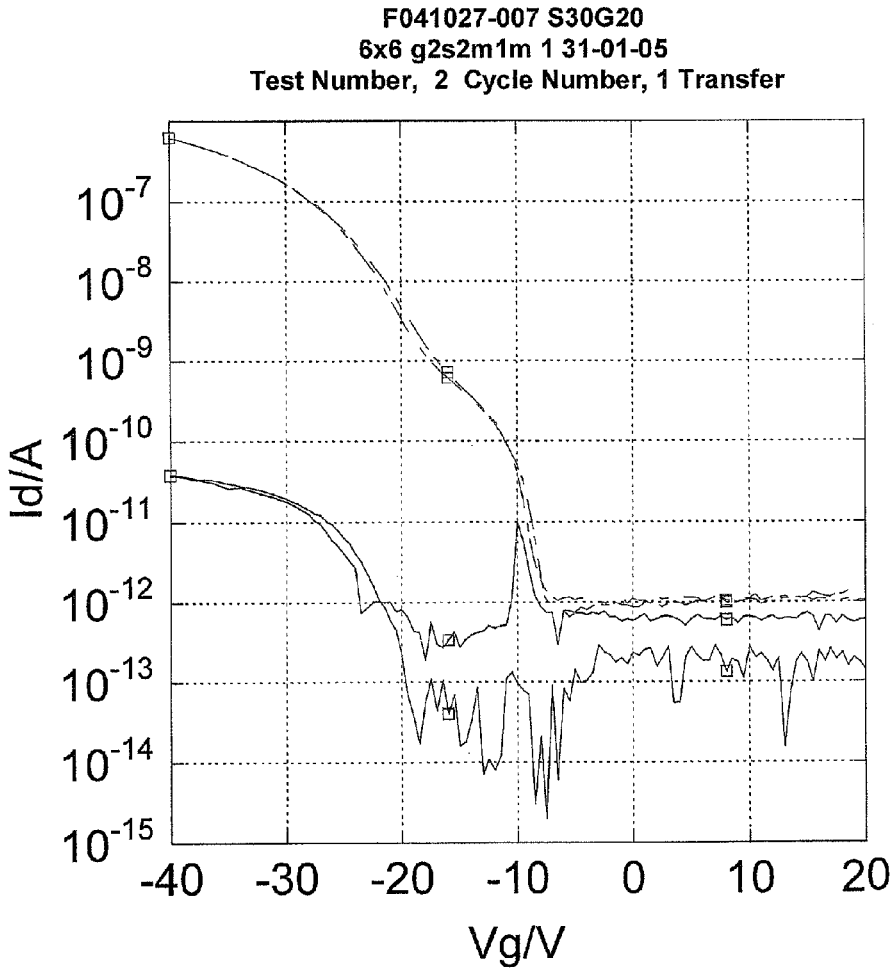
FIG. 11 shows a graph of drain current against gate voltage illustrating characteristics of a pixel TFT with laser ablated gold gate interconnects showing good on and off currents measured for a TFT fabricated as described herein.

Device characteristics measured of pixel TFTs fabricated as described above showed that there was no significant gate leakage from the isolated gates formed from by the laser ablation technique. This shows that the creation of a groove in the dielectric layer in the overlap region does not constitute a significant leakage path from the gate level to any of the conducting pathways on the source-drain level. The process described above is able to achieve a high throughput of presently up to 20000 devices per second for a single shot process. FIG. 11 illustrates that good on and off currents are obtained for the TFT design as discussed above.

EXAMPLE 2

Using the Technique of Laser Ablation Through Adjacent Overlapping Masks for Integrated Circuits The technique described above can be applied for regular array configurations where it is possible to place the region of overlap between subsequent laser exposures in a region of the substrate that does not contain metal structures in the underlying layers of the substrate. For many integrated circuit configurations with more aperiodic structures it might not always be possible to lay out the circuit to avoid metal features being present in the region of overlap. According to a second example, therefore, a sacrificial metal structure is defined on the upper metal level which may or may not be connected to any of the active metal structure on the upper level patterned by laser ablation, which protects the underlying metal during the laser ablation.

In a situation where the die size of the circuit is smaller than the area of single-shot exposure it is of course possible to expose and ablate directly the entire circuit structure with a single shot of the laser, not requiring specific care to design the regions of overlap between subsequent step-and-repeat steps.

However, in circumstances where the circuit is larger than the laser beam, then more than one exposure (shot) is required to define the circuit. In these instances, the gate mask may be partitioned into separately imaged regions. When the circuit is larger than the laser beam, a mask is used that creates a ablation region for the laser ablation process. A suitable mask is designed such that the mask is partitioned into sub-fields. These sub-fields comprise individual segments that shield the lower conductive material, that is preferably gold, from the laser beam. An example of a mask design for the gate pattern for a logic circuit is shown in FIG. 12.

Figure 12:
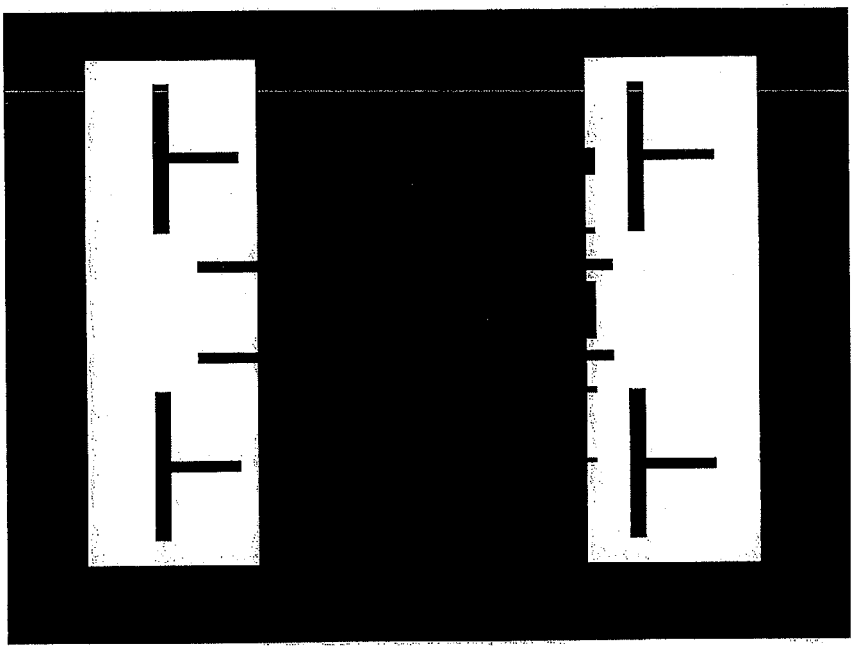
FIG. 12 shows an example of a mask design for a gate pattern for a logic circuit.
Figure 13:
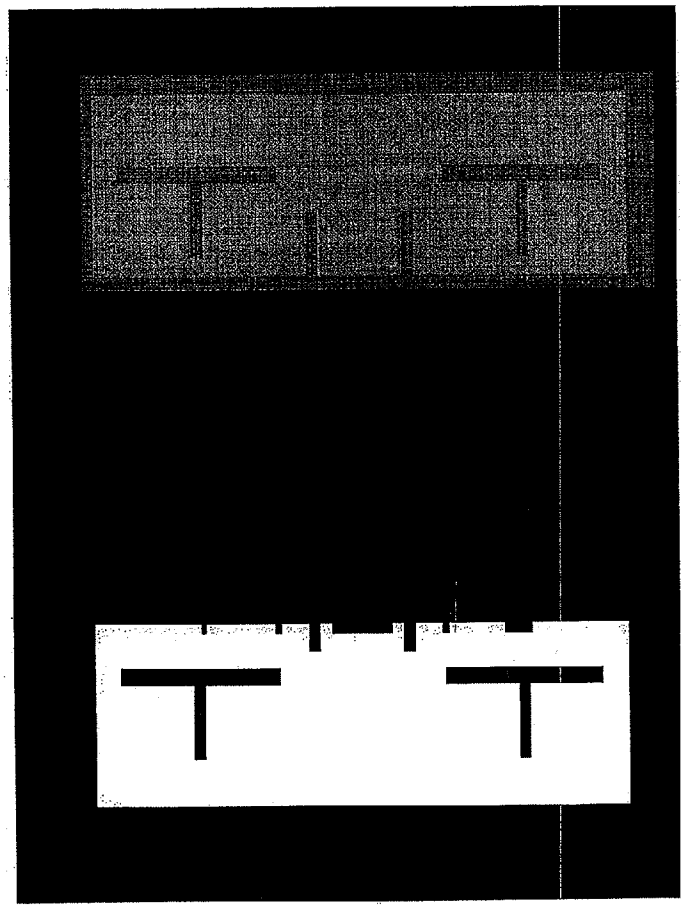
FIG. 13 illustrates a mask design where a laser beam has been shot at the left hand side sub-field to be imaged on the substrate surface and the right hand side sub-field still remains to be imaged.

FIG. 12 shows a mask that has been divided into two sub-fields. The mask is placed on the substrate surface and a single shot is fired through the ablation (clear) region of the mask. Once a portion of the substrate has been imaged (ablated) using one of the sub-fields then the mask is moved to an adjacent position along the substrate surface in order to image an adjacent part of the substrate using the remaining sub-field of the mask. FIG. 13 illustrates the above, where a laser beam has been shot at the left hand side sub-field to be imaged on the substrate surface and the right hand side sub-field still remains to be imaged. The mask is then moved such that We right hand sub-field is at an adjacent position on the substrate and a laser beam will then be shot onto the right hand side of the mask. As stated above, the overlap region will experience two shots of the laser beam and therefore this region must not fall where there is conductive material in the underlying layers.

Figure 14:
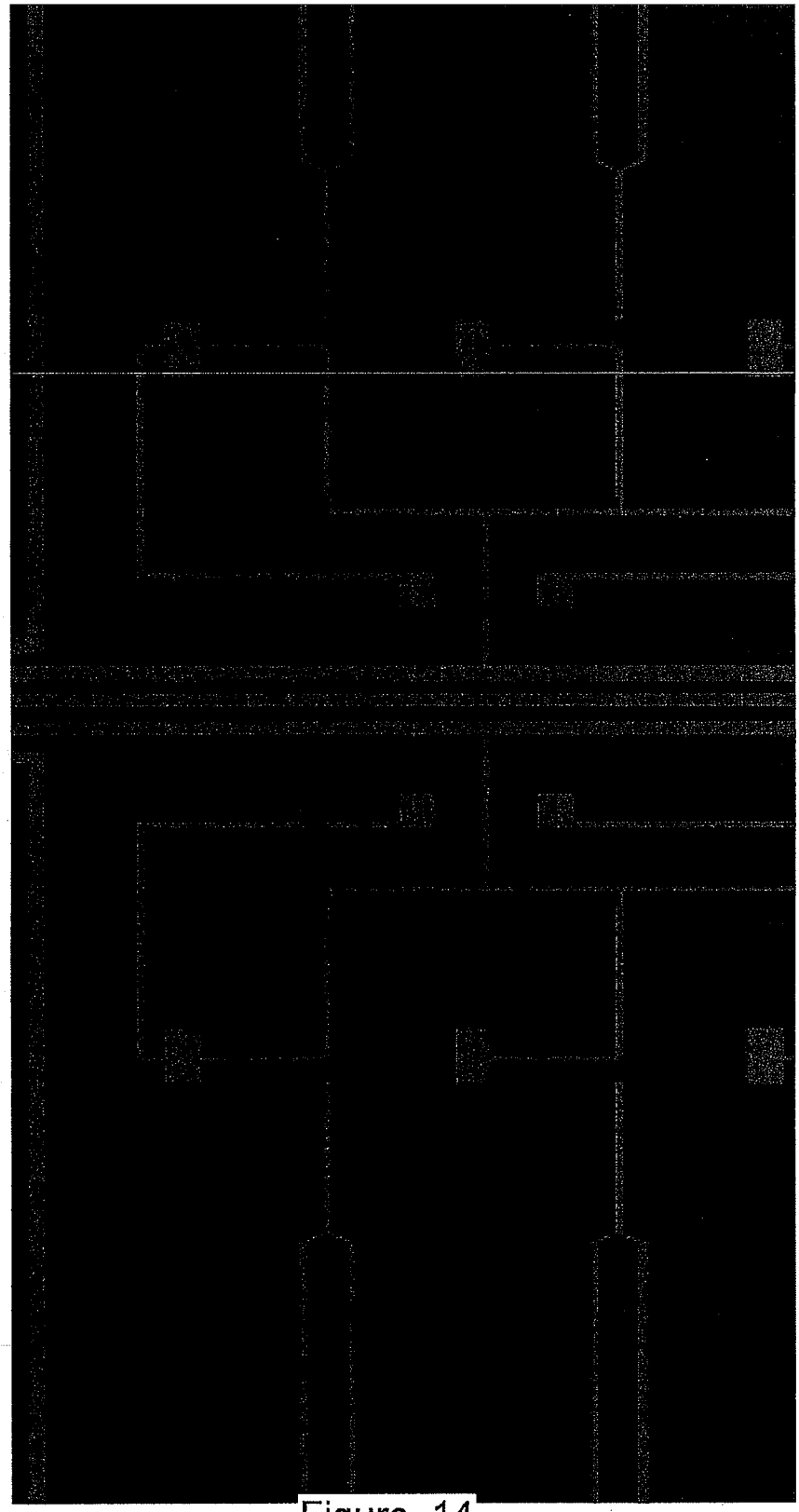
FIG. 14 shows a schematic of an integrated circuit diagram on the source and drain level.

FIG. 14 shows a schematic diagram of an integrated circuit at the source and drain level, which is to be patterned at the gate level using the mask of FIG. 13. After deposition of semiconductor and gate dielectric, as described in detail in Example 1 above, a layer of a metallic material, preferably gold is then deposited over the substrate surface. The gate lines are then patterned using the mask. After a single laser shot has been fired into the left hand side sub-field of the mask, the mask is moved to an adjacent position and then the right hand side sub-field of the mask is used to image the next portion of the substrate.

Figure 15:
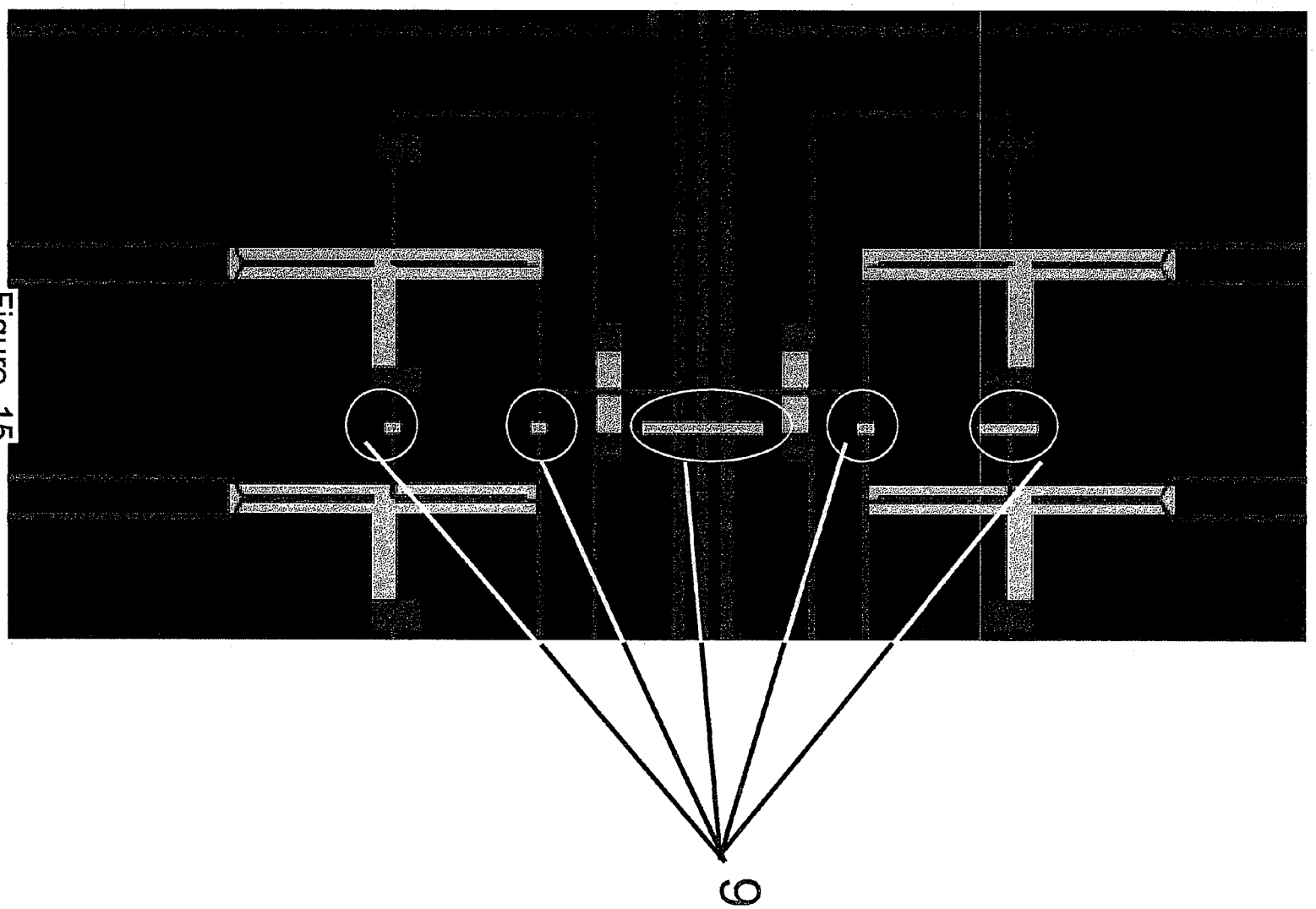
FIG. 15 shows a schematic after the ablation of the metallic material that falls within both of the sub-fields of a mask.

After the ablation of the metallic material, the pattern schematically shown in FIG. 15 then results. It can be seen from FIG. 15 that in the overlap regions where metal lines on the source-drain level need to cross through the overlap region, the mask pattern of (at least) one of the sub-fields has been designed in such a way that those areas are protected by a non-laser exposed area on the mask in which a "sacrificial" gold structure 9 remains on the gate level. This sacrificial structure is not electrically connected to any of the electrodes on the gate level, and therefore does not significantly affect device performance. All other areas in the overlap region have had the gold material ablated from them. In the two-shot overlap region, where it is important that the gold material on the lower level is protected, a region of gold material is deliberately left at the gate level of the circuit. The gold material is left on the gate level after ablation using the sub-field mask design.

The processes and devices described herein are not limited to devices fabricated with solution-processed polymers and vacuum-deposited metals. Some of the conducting electrodes of the TFT and/or the interconnects in a circuit or display device (see below) may be formed from organic or inorganic conductors that can, for example, be deposited by printing of a colloidal suspension or by electroplating onto a pre-patterned substrate.

For the semiconducting layer any vacuum or solution processable conjugated polymeric or oligomeric material that exhibits adequate field-effect mobilities exceeding $10^{-3}$ $cm^2/Vs$, preferably exceeding $10^{-2}$ $cm^2/Vs$, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nano-wires (X. Duan, Nature 425, 274 (2003)).

The electrodes may be coarse-patterned by techniques such as inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. The laser ablation process described herein can be used to provide higher resolution patterning of these electrodes than is achievable with graphic arts printing techniques by trimming the edges of such coarsely patterned features. Devices such as TFTs fabricated as described above may be part of a more complex circuit or device in which one or more such devices can be integrated with each other and/or with other devices. Examples of applications include logic circuits and active matrix circuitry for a display, sensor or a memory device, and user-defined gate array circuits.

The techniques described herein may, in the context of TFT fabrications, also be employed to pattern the source-drain layer of a bottom gate design. The patterning process may also be used to pattern other components of such circuits, such as interconnect lines, resistors, capacitors, inductors, diodes and the like.

The present invention is not limited to the foregoing examples. Aspects of the present invention include novel and/or inventive aspects of the concepts described herein and novel and/or inventive combinations of the features described herein.

The structures described above can be supplemented by other conductive and/or semiconductive structures on the same substrate, for example interconnects. Multiple structures as described above may be formed on the same substrate, and may be connected together by electrically conductive interconnects to form an integrated circuit.

The applicant hereby discloses in isolation each individual feature described herein and any combination of two or more such features, to the extent that such features or combinations are capable of being carried out based oil the present specification as a whole in the light of the common general knowledge of a person skilled in the art, irrespective of whether such features or combinations of features solve any problems disclosed herein, and without limitation to the scope of the claims. The applicant indicates that aspects of the present invention may comprise any such individual feature or combination of features. In view of the foregoing description it will be evident to a person skilled in the art that various modifications may be made within the scope of the invention.

What is claimed is:

[1. A method of fabricating an electronic device, the device comprising a plurality of layers on a substrate, the layers including an upper conductive layer and at least one patterned underlying layer between said conductive layer and said substrate, the method comprising:

patterning said underlying layer; and patterning said upper conductive layer by laser ablation using a stepwise process in which successive areas of said upper conductive layer are ablated by successively applied laser patterns;

wherein said successively applied laser patterns overlap one another in an overlap region; and wherein said method further comprises configuring a said laser pattern and said patterned underlying layer laterally with respect to one another such that in a said overlap region said patterned underlying layer is substantially undamaged by said stepwise laser ablation.]

2. A method as claimed in claim [1] *19* wherein said configuring comprises configuring said pattern of said underlying layer such that material of said underlying layer is substantially absent from a said overlap region.

3. A method as claimed in claim 2 wherein said device comprises a display device, wherein said underlying layer comprises a conductive electrode layer, and wherein said configuring comprises configuring said pattern of said underlying layer to define a plurality of electrode lines each with an adjacent stripe substantially free of conductive material.

[4. A method as claimed in claim 1 wherein said configuring comprises configuring at least one of two said overlapping laser patterns to leave said upper conductive layer substantially unablated in parts of said overlap region beneath which material of said patterned underlying layer is present.]

5. A method as claimed in claim [4] *19* wherein said two overlapping patterns comprise different patterns each defined by a respective sub-field mask.

6. A method as claimed in claim [1] *19* wherein said stepwise laser ablation process comprises repeatedly applying substantially the same laser pattern.

7. A method as claimed in claim [1] *19* further comprising adjusting positions of said successively applied laser patterns or said substrate to compensate for distortion of said substrate.

8. A method as claimed in claim [1] *19* wherein said underlying layer comprises a conductive layer, and wherein said device further comprises a dielectric layer between said upper conductive layer and said underlying layer.

9. A method as claimed in claim 8 wherein said device comprises a thin film transistor (TFT) and wherein one of said underlying layer and said upper conductive layer comprises a source-drain layer of said TFT and the other of said underlying layer and said upper conductive layer comprises a gate layer of said TFT.

10. A method as claimed in claim [1] *19* wherein said device comprises a molecular electronic device.

11. A method as claimed in claim [1] *19* wherein said substrate comprises a flexible substrate.

12. A method as claimed in claim [1] *19* wherein said fabricating comprises fabricating said upper conductive layer over a layer to which said upper conductive layer is adhered, and wherein said ablation operates by a mechanism which includes delamination.

13. A method as claimed in claim [1] *19* wherein said upper conductive layer has an optical density at a wavelength of said laser ablation of at least 0.5.

14. A method as claimed in claim [1] *19* wherein, in the regions of the substrate that are not part of the overlap region, said laser ablation selectively removes substantially only said upper conductive layer from the substrate.

15. A method as claimed in claim [1] *19* wherein said laser ablation comprises single-shot laser ablation.

16. A method as claimed in claim [1] *19* wherein said device is an active matrix display.

17. A method of fabricating a thin film transistor (TFT) active matrix display, sensing device or logic circuit employing the method of claim [1] *19*.

[18. A method of fabricating an electronic device, the device comprising a plurality of layers on a substrate, the layers including an upper conductive layer and at least one patterned underlying layer between said conductive layer and said substrate, the method comprising:

patterning said underlying layer; and patterning said upper conductive layer by laser ablation using a stepwise process in which successive areas of said upper conductive layer are ablated by successively applied laser patterns;

wherein said successively applied laser patterns overlap one another in an overlap region;

wherein said method further comprises configuring a said laser pattern and said patterned underlying layer with respect to one another such that in a said overlap region said patterned underlying layer is substantially undamaged by said stepwise laser ablation; and wherein said configuring comprises configuring said pattern of said underlying layer such that material of said underlying layer is substantially absent from a said overlap region.]

19. A method of fabricating an electronic device, the device comprising a plurality of layers on a substrate, the layers including an upper conductive layer and at least one patterned underlying layer between said conductive layer and said substrate, the method comprising:

patterning said underlying layer; and patterning said upper conductive layer by laser ablation using a stepwise process in which successive areas of said upper conductive layer are ablated by successively applied laser patterns;

wherein said successively applied laser patterns overlap one another in an overlap region;

wherein said method further comprises configuring a said laser pattern and said patterned underlying layer with respect to one another such that in a said overlap region said patterned underlying layer is substantially undamaged by said stepwise laser ablation; and wherein said configuring comprises configuring at least one of two said overlapping laser patterns to leave said upper conductive layer substantially unablated in parts of said overlap region beneath which material of said patterned underlying layer is present.

* * * * *